United States Patent [19]

Sakaki

[11] Patent Number: 5,757,698
[45] Date of Patent: May 26, 1998

[54] NONVOLATILE SEMICONDUCTOR FOR READING DATA AT A READ REQUEST EVEN DURING THE WRITING OF DATA

[75] Inventor: Kinya Sakaki, Tokyo, Japan

[73] Assignee: Kabushiki Kaisha Toshiba, Kawasaki, Japan

[21] Appl. No.: 755,217

[22] Filed: Nov. 22, 1996

[30] Foreign Application Priority Data

Jan. 22, 1996 [JP] Japan .................................. 8-008498

[51] Int. Cl.$^6$ .................................................. G11C 11/34
[52] U.S. Cl. ........................ 365/185.22; 365/189.04
[58] Field of Search ........................... 365/189.04, 185.22

[56] References Cited

U.S. PATENT DOCUMENTS

| | | | |
|---|---|---|---|
| 5,317,537 | 5/1994 | Shinagawa et al. | 365/189.04 |
| 5,594,689 | 1/1997 | Kato | 365/185.22 |

Primary Examiner—Joseph A. Popek
Assistant Examiner—Michael T. Tran
Attorney, Agent, or Firm—Oblon, Spivak, McClelland, Maier & Neustadt, P.C.

[57] ABSTRACT

A nonvolatile semiconductor memory device comprises an electrically erasable programmable memory cell array, a write-only word line and read-only word line provided in a row direction of the memory cell array and connected to corresponding memory cells and a write-only data line and read-only data line provided in a column direction of the memory cell array and connected to the memory cells. A write-only write control circuit for controlling the writing of data and read-only control circuit for controlling the reading of data as well as a write address control circuit are connected to the memory cell array such that, at a read request from an outside during the writing of data to the memory cell array, the write address control circuit checks whether or not there arises a coincidence between a read address and a write address and allows, when there arises a coincidence between these addresses, output polling relative to that data which is loaded as last write data and, when there arises no coincidence, effects switching from an operation of the write control circuit to that of the read control circuit, so that the corresponding data is read out of the memory array.

7 Claims, 3 Drawing Sheets

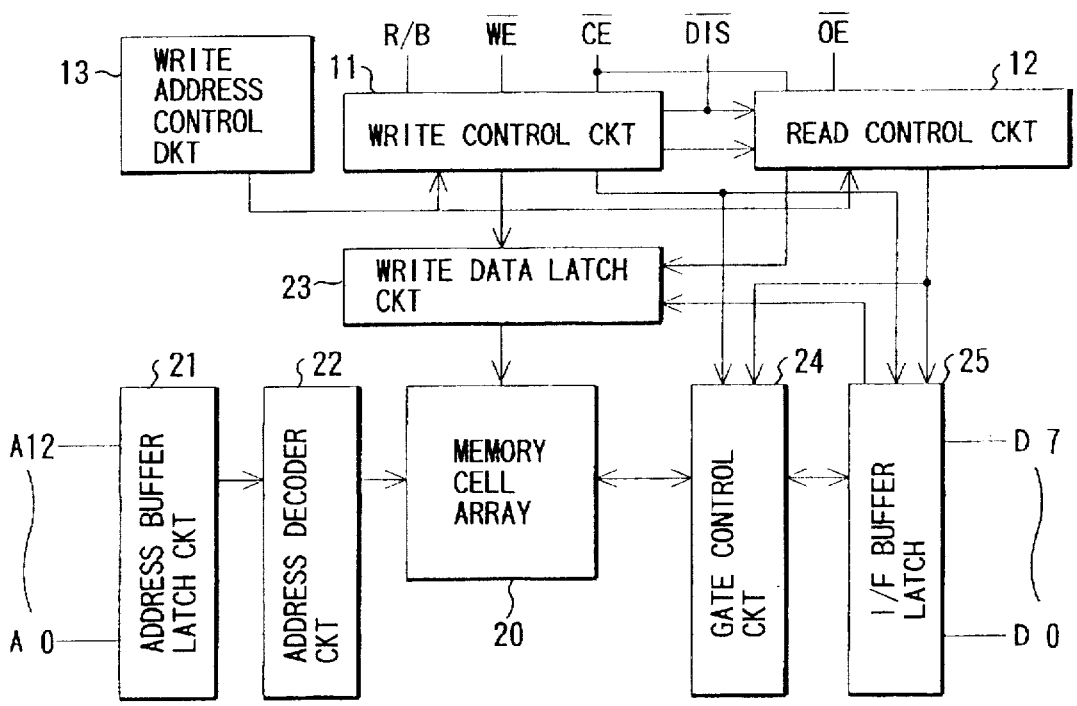
F I G. 2

NONVOLATILE SEMICONDUCTOR FOR READING DATA AT A READ REQUEST EVEN DURING THE WRITING OF DATA

BACKGROUND OF THE INVENTION

1. Field of the Invention

The present invention relates to a nonvolatile semiconductor memory and, in particular, a nonvolatile semiconductor memory used as an EEPROM in a field where it is used in place of a ROM or in a field involved in high-speed data processing.

2. Description of the Related Art

Generally, an EEPROM has a much longer write time than that of other writable memories, such as a RAM, from the standpoint of its characteristics. In those microcomputers using the conventional EEPROM, a method has been adopted by which, during the data writing of the EEPROM, the next access cannot be started and has to be waited until the write operation is ended.

In order to externally detect whether or not the EEPROM is in a write period, data outputting is made through the data polling function of the conventional the EEPROM or an R/B (ready/busy) signal output is monitored.

FIG. 1 is a block circuit arrangement showing part of the conventional EEPROM. A memory cell array 1 is supplied, via a control circuit 3 and write data latch circuit 2, with a ready/busy signal R/B, a serial control signal $\overline{DIS}$, an output enable signal $\overline{OE}$, a write enable signal $\overline{WE}$ and a chip enable signal $\overline{CE}$, where the function of a read-only mode or a write-only mode is selected in accordance with a corresponding external signal.

External signals A12 to A0 are input as address signals to the memory cell array 1 via an address buffer latch 4 and address decoder 5.

The memory cell array 1 has it specific address designated by an input address signal and has its gates controlled by a gate control 6 which is controlled by an output from the control circuit 3. I/O data D7 to D0 are latched to a designated memory cell via an I/O buffer latch 7.

During the writing of data to the EEPROM, the writing operation has been preferentially effected at all times and, even if there is an external read request, the data has been inhibited from being read out and the data has been output through the data polling function.

In the loading of the data into the EEPROM, after initial write data is written into the EEPROM, the control circuit 3 in the EEPROM is operated with the function of a write-only mode. If, therefore, the next write data is loaded or a window time for write data loading is exceeded, then a series of data loaded as the write data up to that time is actually written into the corresponding memory cells in the EEPROM.

Stated in another way, a microcomputer using the conventional EEPROM cannot perform any read operation during write access to the EEPROM and, through the data outputting by the data polling function showing the write access or the monitoring of the R/B signal, the ending of write access to the EEPROM is decided, when each of these has been ended, so that the next access, for example, read access is effected to the EEPROM.

As set out above, said next read access has to wait until the write access of the EEPROM is completed. As a result, the data processing efficiency is markedly lower than in the case of using a RAM.

Generally, where read access is to be done during the write access of the EEPROM, a data polling function works at all time on any addresses and it has been difficult to read data from addresses other than those in the write period.

Further, in the loading of the write data, after the first write data is loaded into the EEPROM, it is not possible to gain read access to the EEPROM, though the next write data can be loaded into the EEPROM.

Since only one data line DL is provided relative to one memory cell in a column direction in the array of the conventional EEPROM, an address determined between the write-only word line WWL and the read-only word line WDL in the row direction cannot be designated for a write-only or a read-only use.

As set out above, since read access cannot be effected during the data write period, a system using the EEPROM has a poor data processing efficiency.

SUMMARY OF THE INVENTION

It is accordingly the object of the present invention to provide an electrically erasable programmable read only memory (EEPROM) which can eliminate defects encountered in a conventional device, read data at a read request from an outside even during the writing of data and largely improve the data processing efficiency of a system using an EEPROM.

In order to achieve the above-mentioned object, a nonvolatile semiconductor memory device is provided which comprises:

an electrically erasable programmable read only memory cell array;

write-only word line WWL and read-only word line RWL provided in a row direction of the memory cell array and connected to a memory cell;

a write-only data line WDL and read-only data line RDL provided in a column direction of the memory cell array and connected to the memory cell;

a write-only write control circuit connected to the memory cell array to control the writing of data;

a read-only read control circuit connected to the memory cell array to control the reading of the data; and a write address control circuit connected to the memory cell array such that, at a read request from an outside during the writing of data to the memory cell array, the write address control circuit checks whether or not there arises a coincidence between a read address and a write address and allows output polling relative to that data which is loaded a last write data when there arises a coincidence between these addresses and effects switching from an operation of the write control circuit to that of the read control circuit, when there arises no coincidence between the addresses, so that corresponding data is read out of the memory array.

In the arrangement as set out above, the nonvolatile memory of the present invention is such that, even during the writing of the data, it can read data out of other than an address to which data is being written. It is, therefore, possible to largely improve the data throughput of a system using the memory of the present invention.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a view showing a block circuit arrangement of part of an EEPROM according to an embodiment of the present invention;

DETAILED DESCRIPTION OF THE PREFERRED EMBODIMENTS

Figure 1:
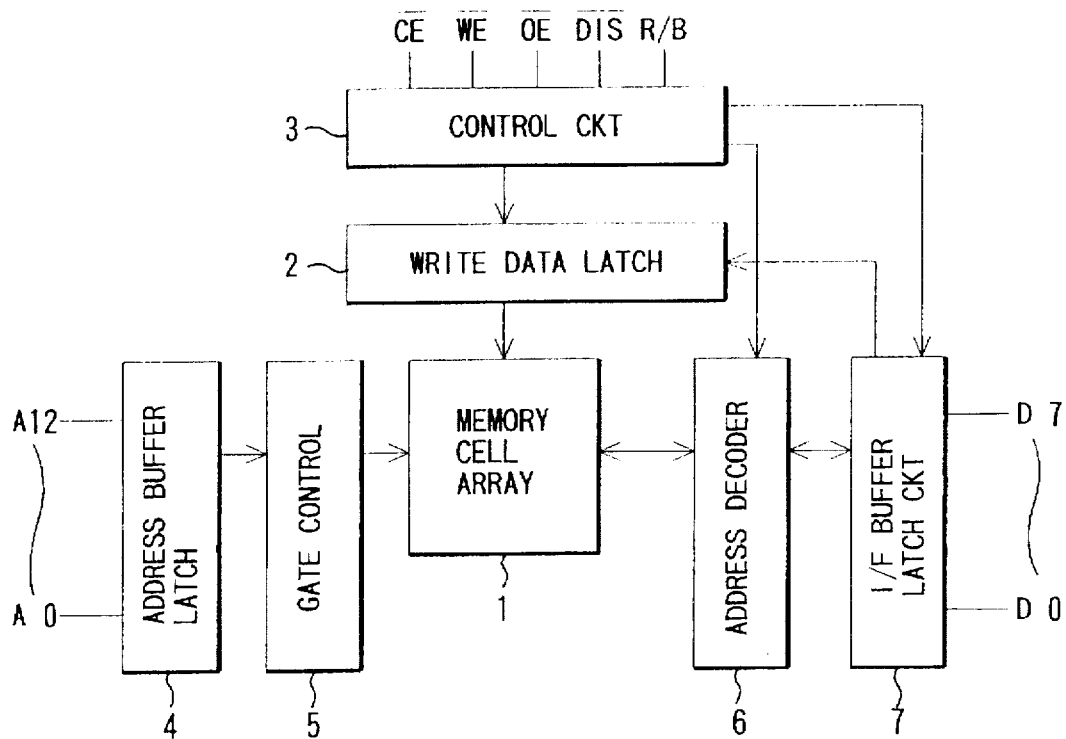
FIG. 1 is a view showing a block circuit arrangement of part of a conventional EEPROM.

One embodiment of the present invention will be explained below with reference to the accompanying drawing.

FIG. 2 is a block circuit arrangement of an EEPROM according to the embodiment of the present invention. In the arrangement of FIG. 2, a memory cell array 20 is supplied with a ready/busy signal R/B, a write enable signal $\overline{WE}$ and a chip enable signal $\overline{CE}$ via a write control circuit 11 and write data latch circuit 23.

A read control circuit 12 is connected via a read data latch circuit 23 to the memory cell array 20 and supplied with an output enable signal $\overline{OE}$, a signal control signal $\overline{DIS}$ and a chip enable signal $\overline{CE}$ and with an output from the write control circuit 11.

The memory cell array 20 selects a write- or a read-only mode function in accordance with an external signal.

External signals A12 to A0 are input, as address signals, to the memory array 20 through an address buffer latch circuit 21 and address decoder circuit 22.

The address buffer latch circuit 21 latches the external signals A12 to A0 and the address decoder circuit 22 receives the address signals from the address buffer latch circuit 21, decodes them and designates a specific one of memory cells in the memory cell array 20.

The write control circuit 11 controls the writing of data to the memory cell array 20.

The read control circuit 12 controls the reading of the data from the memory cell array 20.

A gate control circuit 24 is controlled by the write control circuit 11 and read control circuit 12 and controls the data input/output to a specific one of memory cells in the memory cell array 20.

An input/output (I/O) circuit 25 is controlled by the write control circuit 11 and read control circuit 12 and latches the input/output data D0 to D7.

The address signals A12 to A0 as the external signals input to the memory cell array 20 designate a specific one of the addresses in the memory cell array 20.

Writing the data to the memory cell array 20, that is, to an address-designated specific one of the memory cells in the memory cell array, is achieved by controlling the gate control circuit 24 by the output of the write control circuit 11 while under the controlled write data latch circuit 23.

Reading the data from the memory cell array 20 is achieved by controlling the gate control circuit 24 by the output of the read control circuit 12 to allow data to be output from specific memory cells and, after they are latched to the I/O buffer latch circuit 25, to be output as data D7 to D0.

A write address control circuit 13 checks, at a read request from an outside during the data writing of the memory cell array 20, whether or not there is a coincidence between a read address and a write address and, if a coincidence occurs between the two, allows output polling relative to that data loaded as the last write data and, if their addresses differ, effects switching from the operation of the write control circuit 11 to the operation of the read control circuit so that the read operation may be performed.

As set out above, unlike the conventional EEPROM in FIG. 1, the EEPROM of the present invention has its control circuit separated into the write control circuit 11 for write-only use and read control circuit 12 for read-only use and the write address control circuit 13 is added to the EEPROM.

As a result, even if the data is being written, it is possible to read out the data of the memory cell corresponding to other than the written data.

Figure 3:
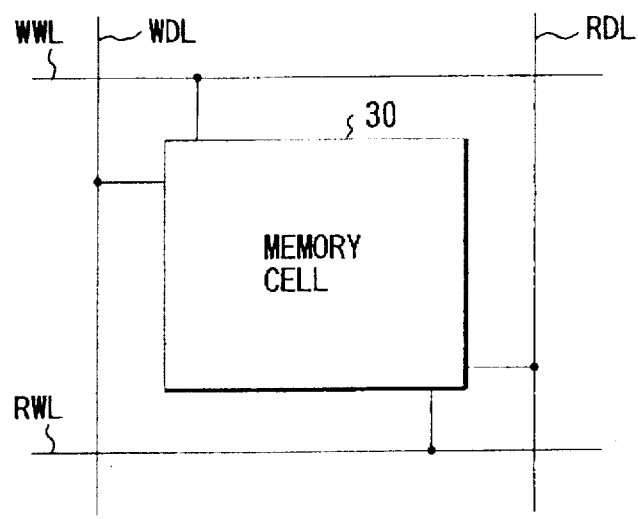
FIG. 3 is a connection diagram of one memory cell of a memory cell array in FIG. 2.

Explanation will be given below about a practical example of a memory cell 30 of a memory cell array in the present embodiment which, as shown in FIG. 3, has a write-only data line WDL and read-only data line RDL as two data lines, in a column direction, relative to one memory cell.

That is, in the memory cell 30 (an EEPROM cell in a memory cell array), a write-only word line WWL and read-only word line RWL are commonly provided as two word lines relative to a plurality of memory cells (only one cell is shown as a representative example) on the same line.

Further, a write-only data line WDL and read-only data line RDL are commonly provided as two data lines relative to a plurality of memory cells 30 on the same line.

Figure 4:
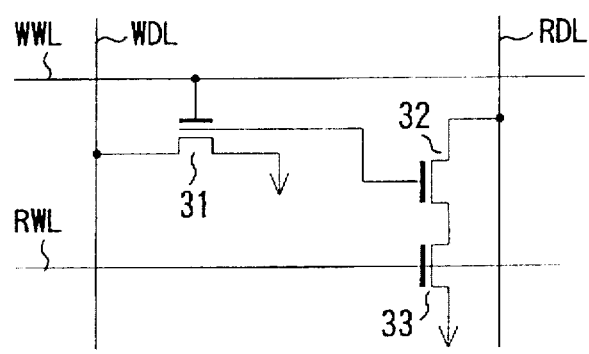
FIG. 4 is a practical circuit of the memory cell shown in FIG. 3.

FIG. 4 shows a practical circuit connection diagram of the memory cell 30 in FIG. 3. The memory cell comprises a cell transistor 31 connected to a write control word line WWL and write data line WDL, a read NMOS transistor 32 connected to a read line RDL, and a read control NMOS transistor 33 connected to a read control word line RWL.

Here, the cell transistor 31 is comprised of an NMOS transistor having a stacked floating gate/control gate structure and is connected at its control gate to the write control word line WWL, at its drain to the write data line WDL and at its source to a predetermined potential mode (for example, a ground node).

Figure 5:
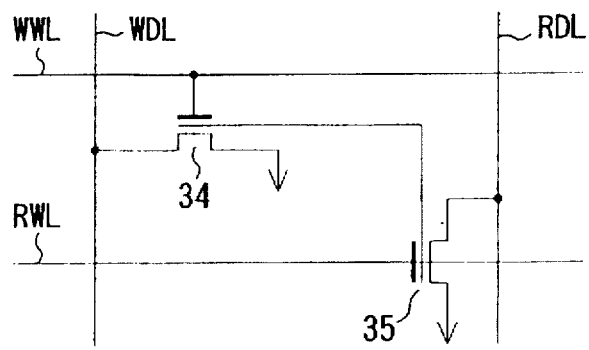
FIG. 5 is another practical circuit of the memory cell shown in FIG. 3.

FIG. 5 shows another practical circuit connection diagram of the memory cell 30. The memory cell 30 comprised a first cell transistor 34 connected to a write control word line WWL and write data line WDL and a second cell transistor 35 connected to a read control word line RWL and read data line RDL.

Here, the above-mentioned cell transistors 34 and 35 are each comprised of an NMOS transistors having a stacked floating/control gate structure and these cell transistors have their floating gates commonly connected together (their floating gates are shared).

Figure 6:
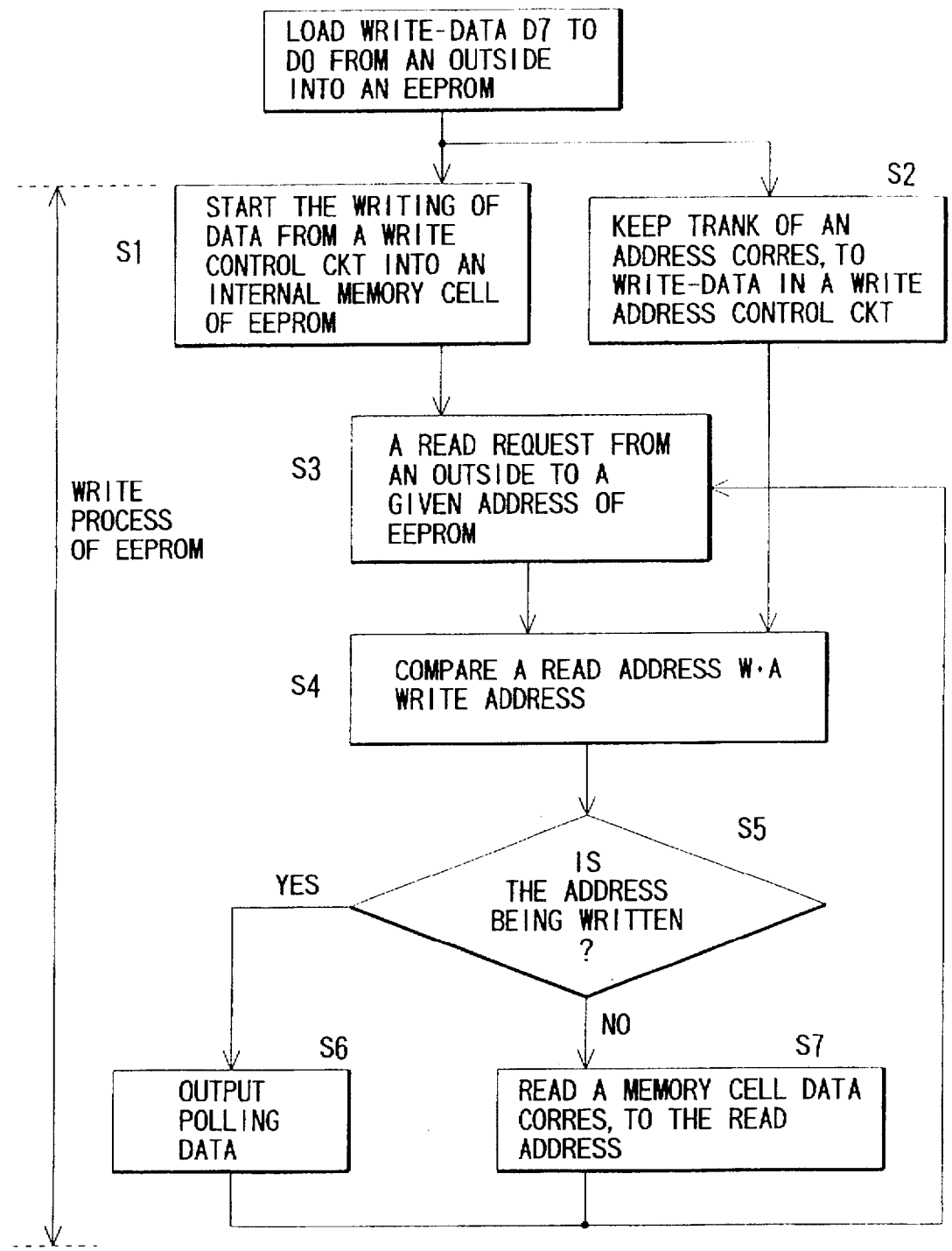
FIG. 6 is a flow chart showing a control operation of a write address control circuit at a read request during the writing of a memory cell in the EEPROM of the present invention.

With reference to a flow chart of FIG. 6, explanation will be given below about the flow of a control operation of a write address control circuit 13 when a read request is issued during write access to the internal memory cells in the EEPROM of FIG. 2.

Let it be supposed that, out of data D7 to D0, one data is written as write data in the EEPROM from an outside.

The write address control circuit 13 as shown in FIG. 2 keeps track of all these addresses into which write data are loaded. This means that it keeps track of the addresses where, at a page write mode for instance, any specific data corresponding to any column of a selected page is rewritten. In this case, at a full page rewrite mode, it simply keeps track of those addresses representing that page.

After the loading of initial write data into the EEPROM, the write operation is started through the write control circuit 11 in the EEPROM (S1).

At this time, the write address control circuit 13 keeps track of the address corresponding to the write data (S2).

When a read request is issued from the outside during the write operation of the EEPROM (S3), the write address control circuit 13 decides whether or not there is any coincidence between a currently writing address (write address) kept track of by the write address control circuit 13 and an address (read address) for which a read request is made (S4) (S5). When the coincidence occurs between both the addresses, the control circuit 13 allows output polling relative to that data loaded as the last write data (S6). When, on the other hand, there occurs no coincidence between the two addresses, the control circuit 13 permits effecting normal readout (S7).

That is, when a read request is issued from the outside during write access to the EEPROM, the control circuit 13 checks whether or not the read address is a currently writing address and effects switching between outputting the corresponding data to an output terminal as output polling and effecting actual data readout relative to the corresponding memory cell.

At the normal reading time, it seemingly appears that the write and read operations are effected at the same time. However, since, during the write access operation, the write data is latched to the write data latch circuit 23, the write operation is internally and automatically performed and, at the read request, the actual read operation is performed, as a separate operation, relative to the internal memory cell and the corresponding data is output to an output data bus.

At this time, as shown in FIGS. 4 and 5, the write address is determined by the write control word line WWL and write data line WDL and, on the other hand, the read address is determined by the read data line RDL and control word line RWL. The read address and write address provide separate addresses and no problem arises because the memory cell to be read out and memory cell to be written are separately handled.

Thus, such two addresses can be accessed simultaneously.

Further, since the write control circuit 11 and read control circuit 12 are provided separately, even after the initial write data has been loaded into the EEPROM, data can be read out between the loading of one write data and the loading of the next write data.

According to the EEPROM of the present embodiment, even in the writing of the data, another data can be read out of an address other than the currently writing address, thus making it unnecessary to wait for the processing until the write operation is complete, time, to omit a time for the write operation to be completed. In this connection it is to be noted that, in the conventional EEPROM, such a wait tie was of the order of 10 ms.

As set out above, the data processing efficiency (throughput) of the system using the EEPROM can be largely improved as set out above. Further, immediately after a write program is executed relative to the EEPROM, the next program can be implemented in the EEPROM.

Where in the prior art a plurality of data stored in the EEPROM are to be copied into other memory areas in the EEROM, they are once stored in a back-up memory, such as a RAM; and then the data is transferred from the back-up memory to the EEPROM. According to the EEPROM of the present invention, on the other hand, the write data and read data can be loaded and unloaded to and from the EEPROM in data length unit in a series fashion.

Consequently, the EEPROM data can be copied into a given page of the EEPROM without the need to interpose the above-mentioned back-up memory. It is thus possible to omit such a copying time and also to use the back-up memory for another processing.

In this case, it is not necessary to copy the data relative to the back-up memory and to use any program for transfer and it is, therefore, possible to improve the efficiency of use in a program storage ROM in a system, such as a microcomputer, using the above-mentioned EEPROM.

In the system using the EEPROM, in general, read access cannot be gained to the EEPROM during write access to the EEPOM and, after the execution of a write command, the next command cannot be fetched, so it has been necessary to control access to the EEPROM on the basis of a program stored in another memory.

According to the EEPROM of the present embodiment, a program which has been stored in a ROM in a conventional system using an EEPROM is stored in the present EEPROM and, by doing so, the program stored in the EEPROM is allowed to be run in the EEROM itself and written into the same EEPROM.

The present invention is very effective to the case where use is made of an application program for allocating any extra space of a memory area in an EEPROM, excluding a program area, as a data storage area or an extended memory area.

The EEPROM of the present invention as set out above can function both as a ROM and a conventional EEPROM and it is, therefore, possible to manufacture, at low cost and in compact from, a system using the EEPROM of the present embodiment.

Further, according to the system using the EEPROM of the present embodiment, it is easier to upgrade an associated software and to change the contents of each application program. It is also possible to shorten the development time of the software and lower its development cost.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
    an electrically erasable programmable memory cell array;
    write-only and read-only word lines provided in a row direction of the memory cell array and connected to memory cells in the memory cell array;
    write-only data line and read-only data line provided in a column direction of the memory cell array and connected to the memory cells;

a write-only write control circuit connected to the memory cell array to control the writing of data;

a read-only control circuit connected to the memory cell array to control the reading of data; and a write address control circuit connected to the write control circuit and the read control circuit such that, at a read request from an outside during the writing of data to the memory cell array, the write address control circuit checks whether or not there arises a coincidence between a read address and a write address and allows output polling relative to data which is loaded as last write data when there arises a coincidence between these addresses and switches from the write control circuit to the read control circuit, when there arises no coincidence between the addresses, so that corresponding data is read out of the memory array.

2. The nonvolatile semiconductor memory according to claim 1, wherein the memory cell array is comprised of a matrix array of memory cells such that row-direction write control word line WWL and read control word line RWL are connected to each memory cell in the same row and column-direction write data line WDL and read data line RDL are connected to each memory cell in the same cell.

3. The nonvolatile semiconductor memory according to claim 2, wherein the memory cell comprises a cell transistor connected to the write-control word line WWL and write data line WDL, a read NMOS transistor connected to the read data line RDL and a read-control NMOS transistor connected to the read control word line RWL.

4. The nonvolatile semiconductor memory according to claim 2, wherein the memory cell comprises a first cell transistor connected to the write control word line WWL and write data line WDL and a second cell transistor connected to the read-control word line RWL and read data line RDL.

5. The nonvolatile semiconductor memory according to claim 2, wherein the write control circuit and read control circuit effect such control as to allow the loading of write data to the memory cell and reading of data from corresponding memory cell, respectively, in a data length unit in a serial fashion.

6. A method for operating a nonvolatile semiconductor memory, comprising the steps of:

loading write data into an electrically erasable programmable memory cell array;

storing an address corresponding to the write data in a write address control circuit;

starting a write operation to a memory cell array cell of the memory cell array;

deciding, at a read request from an outside during the write operation, whether or not there arises a coincidence between a currently writing address and an address for which the read request is made; and controlling the write address control circuit to allow, when there arises a coincidence between these addresses, output polling relative to that data which is loaded as last write data and, when there arises no coincidence between the addresses, data to be read out of the corresponding address.

7. The method according to claim 6, wherein the step of controlling the write address control circuit comprises effecting such control as to enable simultaneous accesses to both a read operation address decided by a write control word line WWL and write data line WDL when the read operation address is different from the requested address and the other address decided by a read control word line RWL and read data line RDL.

* * * * *